United States Patent
Noh et al.

(10) Patent No.: US 7,960,724 B2
(45) Date of Patent: Jun. 14, 2011

(54) COMPOSITION FOR ORGANIC THIN FILM TRANSISTOR, ORGANIC THIN FILM TRANSISTOR FORMED BY USING THE SAME, AND METHOD FOR FORMING THE ORGANIC FILM TRANSISTOR

(75) Inventors: Yong-Young Noh, Daejeon (KR); Jae Bon Koo, Daejeon (KR); In-Kyu You, Daejeon (KR); Kang-Jun Baeg, Gwangju (KR); Dong-Yu Kim, Gwangju (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 162 days.

(21) Appl. No.: 12/542,226

(22) Filed: Aug. 17, 2009

(65) Prior Publication Data

US 2010/0108996 A1     May 6, 2010

(30) Foreign Application Priority Data

Oct. 31, 2008     (KR) .................. 10-2008-0107801

(51) Int. Cl.
   *H01L 51/00*     (2006.01)
(52) U.S. Cl. ........... 257/40; 257/E21.492; 257/E51.005; 257/E51.006; 257/E51.007; 438/99; 438/780
(58) Field of Classification Search .............. 257/40, 257/E21.492, E51.006, E51.005, E51.007; 438/99, 780
See application file for complete search history.

(56) References Cited

U.S. PATENT DOCUMENTS

| | | | |
|---|---|---|---|
| 6,232,157 | B1 | 5/2001 | Dodabalapur et al. |
| 7,256,419 | B2 | 8/2007 | Jeong et al. |
| 7,750,342 | B2 * | 7/2010 | Kim et al. ............. 257/40 |
| 2005/0104058 | A1 | 5/2005 | Veres et al. |
| 2006/0202195 | A1 | 9/2006 | Marks et al. |
| 2006/0284166 | A1 | 12/2006 | Chua et al. |
| 2007/0129473 | A1 * | 6/2007 | Shin et al. ............. 524/261 |
| 2007/0194305 | A1 * | 8/2007 | Kim et al. ............. 257/40 |
| 2008/0067505 | A1 | 3/2008 | Lee et al. |
| 2011/0016061 | A1 * | 1/2011 | Mercier et al. .......... 705/36 R |

FOREIGN PATENT DOCUMENTS

| | | |
|---|---|---|
| EP | 1542241 B1 | 9/2006 |
| JP | 2005171259 A | 6/2005 |
| KR | 1020050058062 A | 6/2005 |
| KR | 1020080011879 A | 2/2008 |
| KR | 1020080043059 A | 5/2008 |

OTHER PUBLICATIONS

Kim, Tae-Dong et al., "Ultralarge and Thermally Stable Electro-optic Activities from Diels-Alder Crosslinkable Polymers Containing Binary Chromophore Systems", Advanced Materials, vol. 18, Issue 22, pp. 3038-3042, Oct. 27, 2006.

(Continued)

*Primary Examiner* — Victor Mandala
(74) *Attorney, Agent, or Firm* — Rabin & Berdo, PC

(57) ABSTRACT

Provided are a composition for organic thin film transistors including a material including an anthracenyl group and a cross-linker including a maleimide group, an organic thin film transistor formed by using the composition, and a method for manufacturing the same.

10 Claims, 4 Drawing Sheets

OTHER PUBLICATIONS

Jung, Cecile et al., "Pentacene-based thin film transistors with titanium oxide-polystyrene/polystyrene insulator blends : High mobility on high K dielectric films", Applied Physics Letters 90, 062111, pp. 062111-1-062111-3, Feb. 6, 2007.

Yoon, Myung-Han et al., "Low-Voltage Organic Field-Effect Transistors and Inverters Enabled by Ultrathin Cross-Linked Polymers as Gate Dielectrics", Journal of the American Chemical Society, vol. 127, No. 29, pp. 10388-10395, Jun. 30, 2005.

Klauk, Hagen et al., "High-mobility polymer gate dielectric pentacene thin-film transistors", Journal of Applied Physics, vol. 92, No. 9, pp. 5259-5263, Nov. 1, 2002.

Kim et al., "Diels-Alder "Click Chemistry" for Highly Efficient Electrooptic Polymers" Macromolecules, vol. 39, No. 5, pp. 1676-1680, Feb. 2, 2006.

De Deus et al., "Nanomechanical properties of poly(methyl methacrylate-co-9-anthryl methyl methacrylate)" Surface and Coating Technology, vol. 201, No. 6, pp. 3615-3620, Nov. 17, 2006.

* cited by examiner

COMPOSITION FOR ORGANIC THIN FILM TRANSISTOR, ORGANIC THIN FILM TRANSISTOR FORMED BY USING THE SAME, AND METHOD FOR FORMING THE ORGANIC FILM TRANSISTOR

CROSS-REFERENCE TO RELATED APPLICATIONS

This U.S. non-provisional patent application claims priority under 35 U.S.C. §119 of Korean Patent Application No. 10-2008-0107801, filed on Oct. 31, 2008, the entire contents of which are hereby incorporated by reference.

BACKGROUND

The present invention disclosed herein relates to a composition for organic thin film transistors, an organic thin film transistor formed by using the composition, and a method for forming the organic thin film transistors by using the composition.

Organic thin film transistors (OTFTs) can be applied in various flexible electronic devices such as driving devices for the next generation flexible displays (or a logic circuit of extremely low priced Radio Frequency Identification (RFID) tags for individual item unit identification). Thus, recent studies on OTFTs have been actively conducted.

In the OTFT manufacturing process, polymer materials can be provided as a solution, and thus used in roll to roll processes. Therefore, a manufacturing process using polymer materials can be performed at lower manufacturing costs than typical transistor manufacturing processes.

SUMMARY

The present invention provides a composition for organic insulating layers having excellent electrical characteristics.

The present invention also provides organic thin film transistors including organic insulating layers having excellent electrical characteristics.

The present invention also provides a method for manufacturing organic thin film transistors including organic insulating layers manufactured by simple processes, but having excellent electrical characteristics.

Embodiments of the present invention provide compositions for organic thin film transistors, including a material represented by Chemical Formula I or II and a cross-linker with a maleimide group

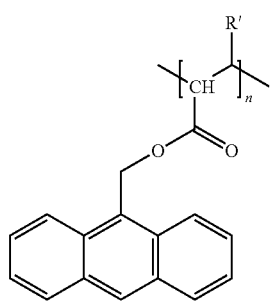
(I)

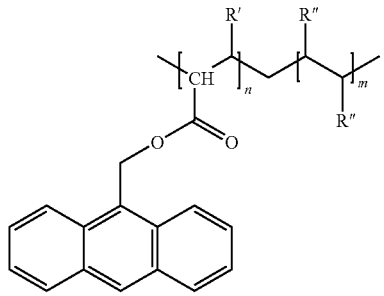
(II)

wherein each of R' and R" in Chemical Formula I or II may be one selected from a hydrogen atom, a hydroxyl group, an ester group, an amide group, and alkyl group or an alkoxy group having 1 to 12 carbon numbers, n in Chemical Formula I may be a positive integer, n and m in Chemical Formula II may be positive integers and the ratio of m to n (m/n) may be more than 0 and less than or equal to 99.

In some embodiments, the cross-linker with a maleimide group may be one selected from Chemical Formulas III, IV, V, and VI:

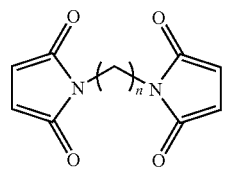
(III)

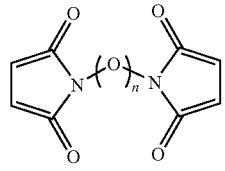
(IV)

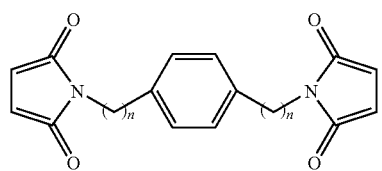
(V)

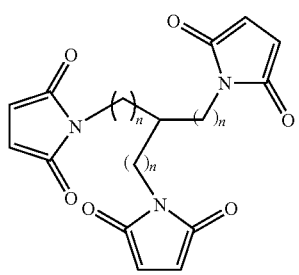
(VI)

wherein n in Chemical Formulas III, IV, V, or VI is an integer of 1 to 10.

In other embodiments, the amount of the cross-linker may be 10 to 100 parts by weight in 100 parts by weight of the material.

In still other embodiments, the composition may further include an organic solvent.

In other embodiments of the present invention, organic thin film transistors include an organic insulating layer formed by a cross-linkage between a material represented by Chemical Formula I or II and a cross-linker with a maleimide group.

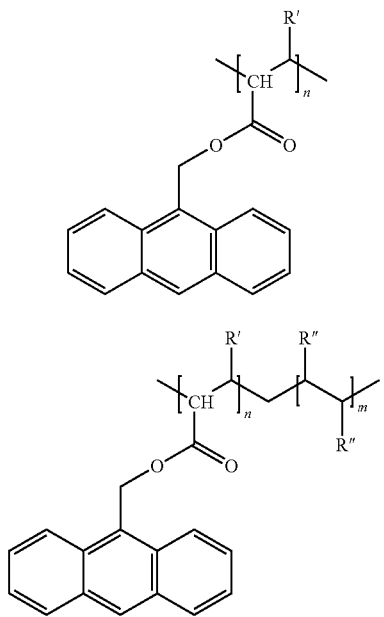

In Chemical Formula I or II, R' and R" each may be one selected from a hydrogen atom, a hydroxyl group, an ester group, an amide group, and an alkyl group or an alkoxy group having 1 to 12 carbon numbers. In Chemical Formula I, n may be a positive integer. In Chemical Formula II, n and m may be positive integers and the ratio of m to n (m/n) may be more than 0 and less than or equal to 99.

In some embodiments, the organic insulating layer may be formed on a substrate, and the organic thin film transistor may further comprise a source electrode, a drain electrode, an organic insulating layer, and a gate electrode.

In still other embodiments of the present invention, methods for forming organic thin film transistors include preparing a solution containing a material represented by Chemical Formula I or II and a cross-linker with a maleimide group, coating the solution on a substrate; and subjecting the coated substrate to a heat treatment to form an organic insulating layer on the substrate.

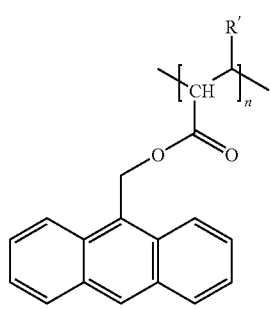

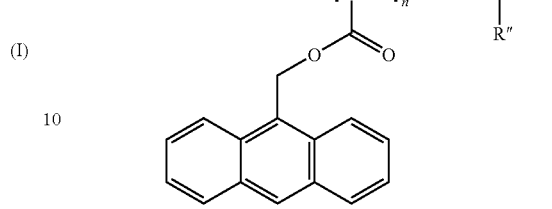

In Chemical Formula I or II, R' and R" each may be one selected from a hydrogen atom, a hydroxyl group, an ester group, an amide group, and an alkyl group or an alkoxy group having 1 to 12 carbon numbers. In Chemical Formula I, n may be a positive integer. In Chemical Formula II, n and m may be positive integers and the ratio of m to n (m/n) may be more than 0 and less than or equal to 99.

In some embodiments, by the heat treatment, a Diels-Alder reaction occurs between the material and the cross-linker.

In other embodiments, the method may further include forming a gate electrode on the substrate prior to the coating of the solution; and forming an organic active layer on the organic insulating layer and forming a source and a drain after the forming of the organic insulating layer.

In still other embodiments, the method may further include forming a source and a drain on the substrate and forming an organic active layer on the substrate prior to the coating of the solution; and forming a gate electrode on the organic insulating layer after the forming of the organic insulating layer.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF EMBODIMENTS

Figure 1:
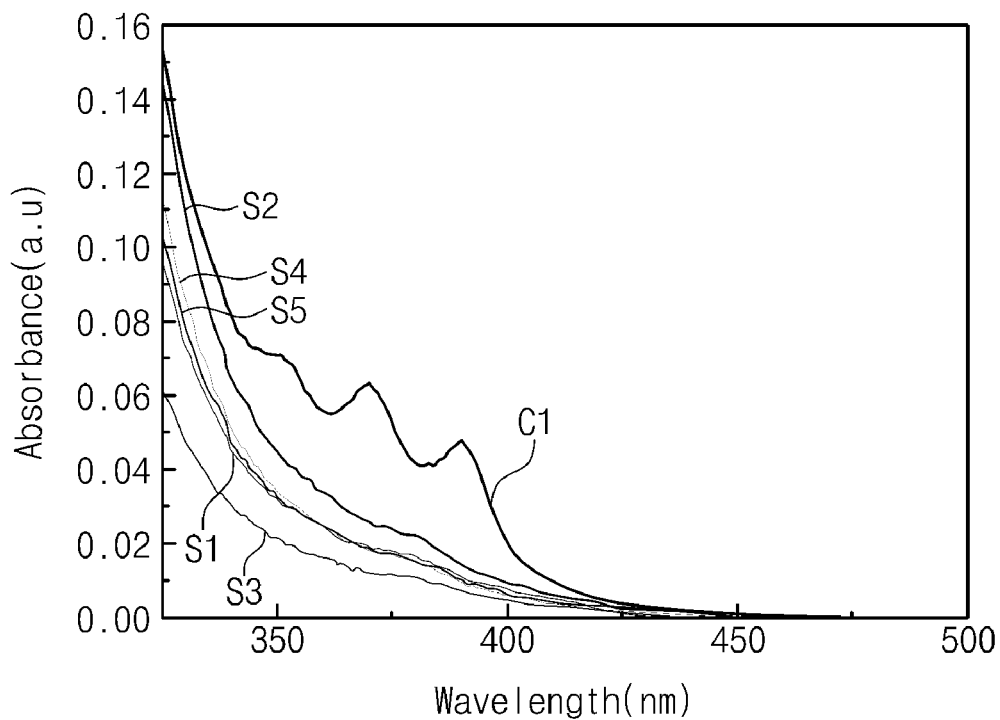
FIG. 1 is a graph showing UV absorbance of the organic insulating layer in accordance with embodiments of the present invention and UV absorbance of the coating layer in accordance with a comparative embodiment of the present invention.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present In the specification, it will be understood that when any material layer such as a conductive layer, a semiconductor layer, or an insulating layer is referred to as being 'on' another film or substrate, it can be directly on the other film or substrate, or intervening layers may also be present. Also, though terms like a first, a second, and a third are used to describe various regions and materials in various embodiments of the present invention, the regions and the materials are not limited to these terms. These terms are used only to discriminate one region from another region. Therefore, a region referred to as a first region in one embodiment can be referred to as a second region in another embodiment.

In the specification, it should be understood that the term 'and/or' refers to one or all of the listed elements before and after the term.

According to embodiments of the present invention, a composition for organic thin film transistors will be described.

The composition may include an organic material with an anthracenyl group. For example, the organic insulating material may be represented by Chemical Formula (I) or (II):

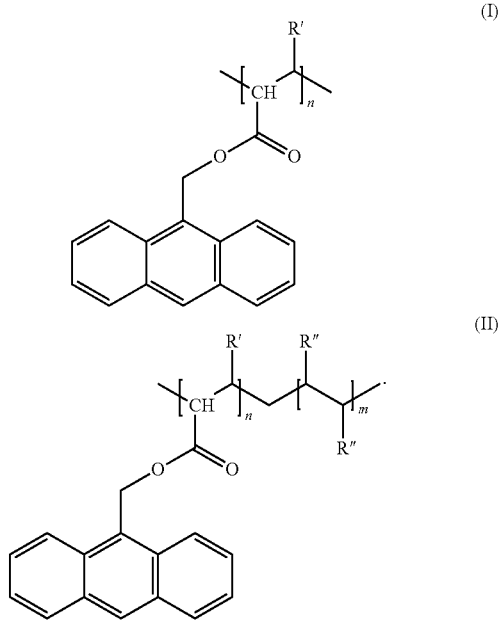

In Chemical Formula (I) or Chemical Formula (II), R' and R" each may be one selected from a hydrogen atom, a hydroxyl group, an ester group, an amide group, and an alkyl group or alkoxy group having 1 to 12 carbon atoms, and in Chemical Formula (I), n may be any positive integer. In Chemical Formula (II), n and m may be any positive integer and the ratio of m to n (m/n) may be more than 0 and less than or equal to 99.

For example, n and m in Chemical Formula (II) may be expressed in a ratio form (eg, n:m=a:b). Then, the sum of a and b is 1, a may be any real number which is more than or equal to 0.01 and less than 1, and b may be any real number which is more than 0 and less than or equal to 0.99.

The composition may also include a cross-linker with a maleimide group. The cross-linker with a maleimide group may be represented by one of the following Chemical Formulas (III), (IV), (V), or (VI):

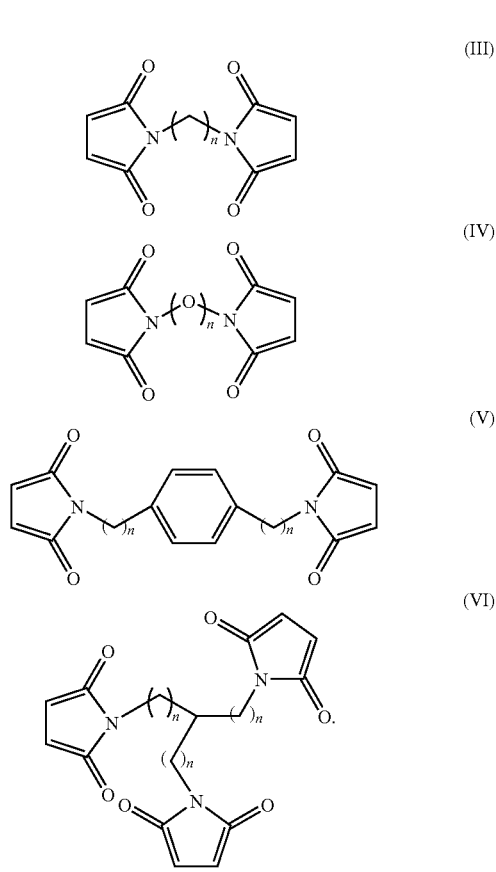

In Chemical Formulas (III), (IV), (V), or (VI), n may be any integer of 1 to 10.

The composition may further include an organic solvent.

An organic insulating film may be formed by using the composition.

At least one selected from the organic materials and at least one selected from cross-linkers may be mixed with the solvent. A mixture thus formed may be coated on a substrate. A coating layer formed on the substrate may be subjected to a heat treatment. By the heat treatment, a Diels-Alder reaction may occur between an anthracenyl group of the organic material and a maleimide group of the cross-linker. The solvent in the coating layer may be removed. Thus, a cross-linked organic insulating layer may be formed on the substrate.

Then, when n is more than 10 in Chemical Formulas (III), (IV), (V), or (VI) as a cross-linker, free space between the polymer chains formed may be enlarged, thereby deteriorating the insulation characteristics of the organic insulating layer. Thus, n may be 10 or less. The degree of crosslinking of the organic insulating layer may be controlled by the number of the maleimide functional groups included in Chemical Formulas (III), (IV), (V), or (VI) as a cross-linker.

In the composition, the mixing ratio of the cross-linker may be controlled in consideration of the number of the anthracenyl groups of the organic material. The degree of crosslinking may be low when the cross-linker is present at about 10 parts by weight per hundred (based on the weight of the organic material as 100), and the cross-linker may remain after reaction when the cross-linker is present at more than about 100 parts by weight. This can deteriorate the insulation characteristics of the formed organic insulating layer. Thus, the mixing ratio of the cross-linker may be about 10 to about 100 parts by weight.

The composition including the organic material and the cross-linker may be mixed with the organic solvent at about 1 wt % to about 30 wt %, in consideration of its coatability. The organic solvent may be dichloroethane or trichloroethylene.

The coating method of the mixture may be spin coating, drop casting, inkjet printing, and the like. Other direct printing methods may be used.

A heat treatment may be performed at normal pressure, and at 95° C.-110° C. for cross-linkage. The cross-linkage occurs at relatively low temperatures without any additional process (for example, UV irradiation).

Hereinafter, a method for forming an organic insulating layer and whether the organic insulating layer can be formed will be described in accordance with exemplary embodiments.

3 wt % (of a solvent) poly((methylmethacrylate)-co-(2-anthracenylmethyl acrylate)) (Sigma Aldrich) including a anthracenyl group as a side branch was dissolved in the solvent to prepare a solution. At this time, dichloroethane was used as a solvent. 1,1'-(Methylenedi-4,1-phenylene)bis-maleimide (Sigma Aldrich) was mixed as a cross-linker with the solution. At this time, the 1,1'-(Methylenedi-4,1-phenylene)bis-maleimide was added in the same weight ratio (for example, 1:1) in relation to the content of the poly((methylmethacrylate)-co-(2-anthracenylmethyl acrylate) mixed with the solution.

Subsequently, the solution including the 1,1'-(Methylenedi-4,1-phenylene)bis-maleimide and the poly((methylmethacrylate)-co-(2-anthracenylmethyl acrylate) was stirred enough to dissolve the materials in the solvent. After the materials were completely dissolved in the solvent, the solvent was filtered using a Teflon syringe filter in order to remove particles which remain in the solution.

The solution was coated on the substrate to form a coating layer. The coating layer was formed by spin coating, and coated at 2000 rpm for 1 min. Subsequently, the coating layer was subjected to a heat treatment. The heat treatment was performed at 100° C. for 10 minutes at normal pressure using a hot plate. By the heat treatment, cross-linking reactions occurred with the solution being removed in the coating layer. Thus, an organic insulating layer was formed on the substrate.

The thickness of the organic insulating layer was about 150 nm. At this time, the thickness of the organic insulating layer was measured by a step-profiler. The thickness of the organic insulating layer can be controlled by the concentration of the organic material including anthracenyl groups. For example, about 1 wt % poly((methylmethacrylate)-co-(2-anthracenylmethyl acrylate) was used to form an organic insulating layer with a thickness of about 70-100 nm and about 0.5 wt % poly((methylmethacrylate)-co-(2-anthracenylmethyl acrylate) was used to form an organic insulating layer with a thickness of 50-70 nm.

By the process, organic insulating layer samples were prepared.

A comparative sample (C1) was prepared to be compared with the samples. To prepare the comparative sample (C1), a coating layer was formed on a substrate by the same process as the manufacturing process of the samples. However, a heat treatment was not performed on the coating layer.

Referring to FIG. 1, the formation of an organic insulating layer was identified in the exemplary embodiment.

The samples were prepared at different heat treatment temperatures, respectively. For example, a first sample (S1) was subjected to a heat treatment at 90° C. and prepared, a second sample (S2) was subjected to a heat treatment at 100° C. and prepared, a third sample was subjected to a heat treatment at 110° C. and prepared, a fourth sample was subjected to a heat treatment at 120° C. and prepared, and a fifth sample was subjected to a heat treatment at 130° C. and prepared.

The UV-VIS absorbances of the comparative sample (C1) and the first to the fifth samples (S1~S5) were measured.

The coating layer of the comparative sample (C1) includes compositions which do not form a cross linkage. Thus, the absorption peak of an unreacted anthracenyl group can be shown. Referring to FIG. 1, the comparative sample (C1) showed three absorption peaks in the range of 350 nm to 400 nm (for example, at 350 nm, 370 nm, and 390 nm). That is, any cross-linking reaction did not occur between anthracenyl group and maleimide group included in the composition used in formation of the comparative sample (C1).

On the contrary, the samples (S1~S5) did not show any absorption peak. That is, the samples (S1~S5) did not include any unreacted and remaining anthracenyl group. Thus, in the samples (S1~S5), a formation of organic insulating layers cross-linked by a Diels-Alder reaction between anthracenyl group and maleimide group was identified. Furthermore, although the first sample (S1) was treated at low temperatures of 100° C. or less, the sample included an organic insulating layer formed by a cross-linking reaction between anthracenyl group and maleimide group.

Figure 2A:
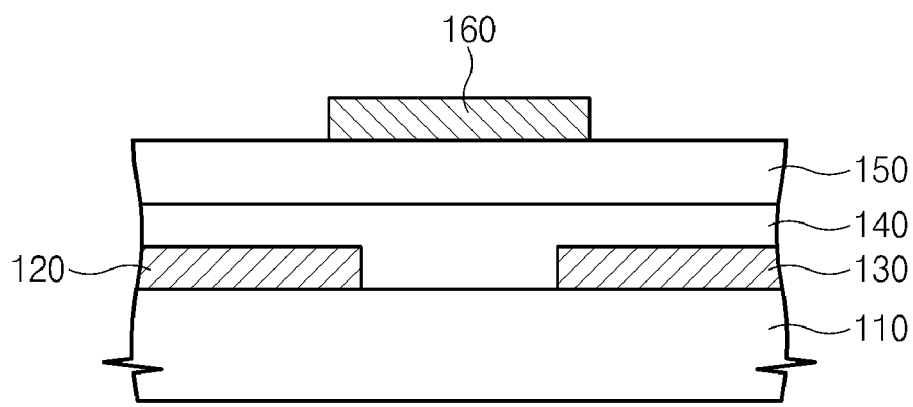
FIGS. 2A through 2C are schematic views showing an organic thin film transistor in accordance with embodiments of the present invention.
Figure 2B:
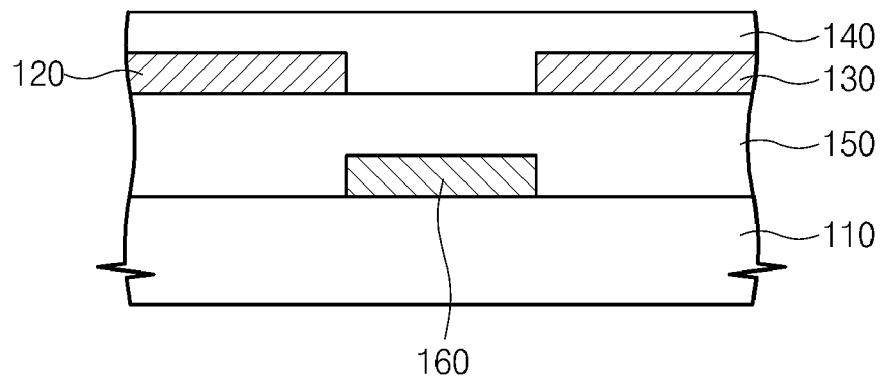
Figure 2C:
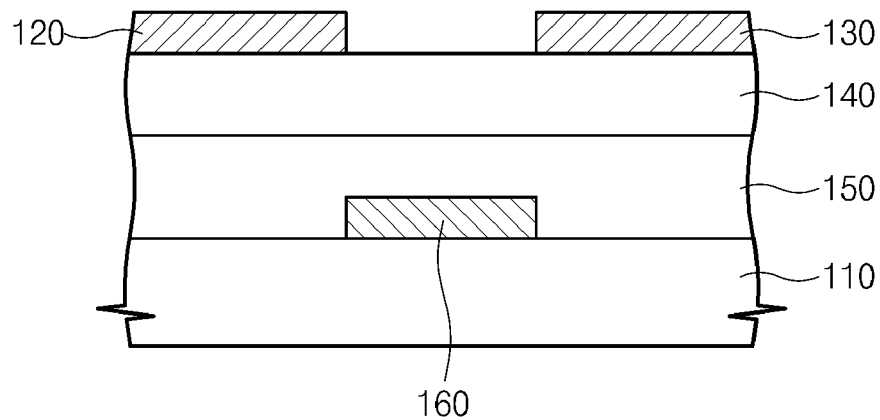

Referring to FIGS. 2a through 2c, organic thin film transistors including an organic insulating layer formed by the composition and a method for manufacturing the same will be described below.

The organic thin film transistor includes a substrate, a gate electrode, a gate insulating layer, an organic active layer, and source/drain electrodes. At this time, the organic insulating layer is used as the gate insulating layer.

Referring to FIG. 2a, a source electrode 120 and a drain electrode 130 are formed to be disposed spaced apart on a substrate 110. An organic active layer 140 may be formed on the substrate 110. The organic active layer 140 may cover the source electrode 120 and the drain electrode 130. A gate insulating layer 150 may be formed on the organic active layer 140. A gate electrode 160 may be formed to be disposed on the gate insulating layer 150 between the source electrode 120 and the drain electrode 130.

Referring to FIG. 2b, a gate electrode 160 may be formed on a substrate 110. A gate insulating layer 150 may be formed on the substrate 110 to cover the gate electrode 160. A source electrode 120 and a drain electrode 130 may be formed on the gate insulating layer 150 to be spaced apart the gate electrode 160. An organic active layer 140 may be stacked on the gate insulating layer 150 to cover the source electrode 120 and the drain electrode 130.

Referring to FIG. 2c, a gate electrode 160 may be formed on a substrate 110. A gate insulating layer 150 may be formed on the substrate 110 to cover the gate electrode 160. An organic active layer 140 may be stacked on the gate insulating layer 150. A source electrode 120 and a drain electrode 130 may be formed on the organic active layer 140 to be spaced apart the gate electrode 160.

In FIGS. 2a through 2c, the substrate 110 may be a n-type or p-type doped silicon wafer. Alternatively, the substrate 110 may be a glass substrate. Alternatively, the substrate 110 may be a plastic film including at least one material selected from the group consisting of polyethersulphone, polyacrylate, polyetherimide, polyimide, and polyethyleneterephtalate. The substrate 110 may include an indium tin oxide coated on the surface.

The gate electrode 160 and the source/drain electrodes 120 and 130 may include a metal or a conductive polymer. For example, the gate electrode 160 and the source/drain electrodes 120 and 130 may include Au, Ag, Al, Ni, and/or indium tin oxide (ITO). Also, the gate electrode 160 and the source/drain electrodes 120 and 130 may include polyethylenedioxythiophene:polystyrene sulfonate (PEDOT:PSS), polypyrrole, and/or polyaniline. The source/drain electrodes 120 and 130 may be formed by a vapor deposition process and a photolithography process or an inkjet printing technique. The gate electrode 160 may be formed by a vapor deposition process using a shadow mask, or an inkjet printing technique.

The organic active layer 140 may include polythiophene, thieno thiophene, triisopropylsilyl pentacene, pentacene precursor, polyfluorene, pentacene, tetracene, anthracene, perylene, rubrene, coronene, perylene tetracarboxylic diimide, polyparaphenylene vinylene, polythiophene vinylene, oligothiophene such as α-5-thiophene or α-6-thiophene, phthalocyanine containing or not containing a metal, and/or naphthalene tetra carboxylic acid diimide, and/or derivatives thereof. The organic active layer 140 may be formed by a solution process such as spin coating or inkjet printing.

As described above in the method, the gate insulating layer 150 may be an organic insulating layer formed by a cross-linkage between anthracenyl group and maleimide group. The organic insulating layer has a solvent resistance to organic solvents after a cross-linking reaction. Thus, another thin film may be formed by a solution process on the organic insulating layer, as described in the manufacturing method.

Figure 3A:
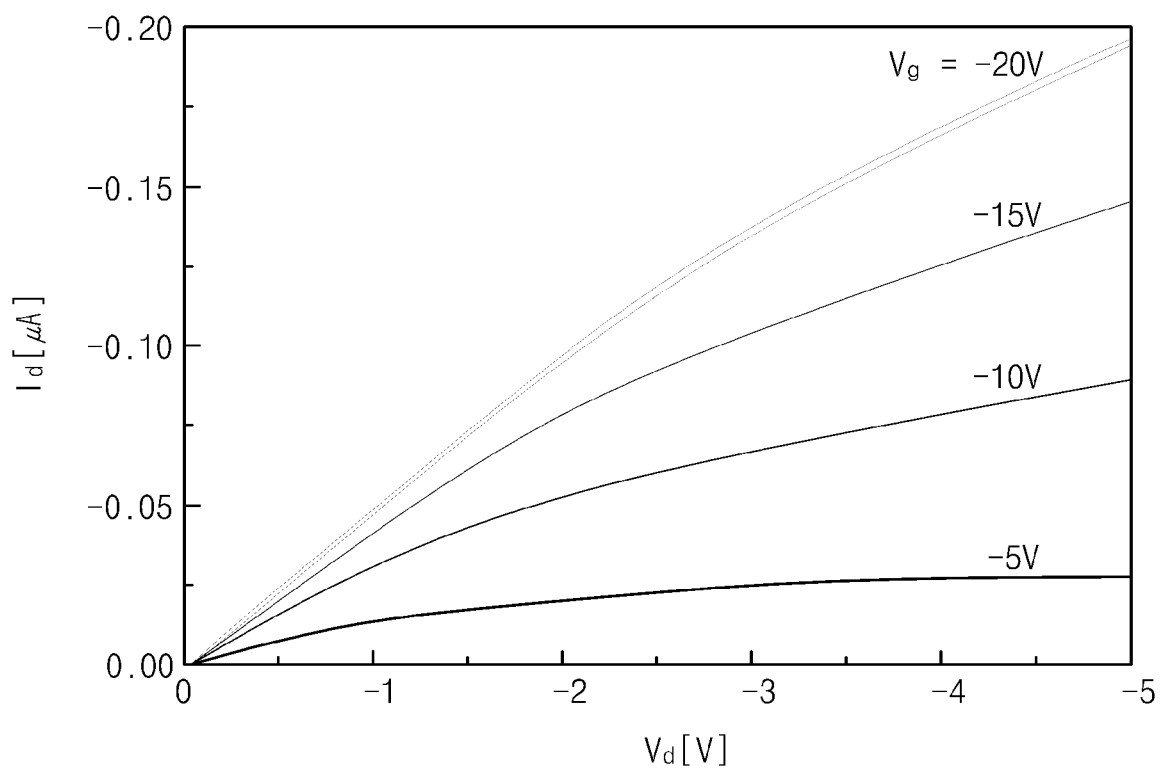
FIG. 3A is a output curve of the organic thin film transistors in accordance with the embodiments of the present invention.
Figure 3B:
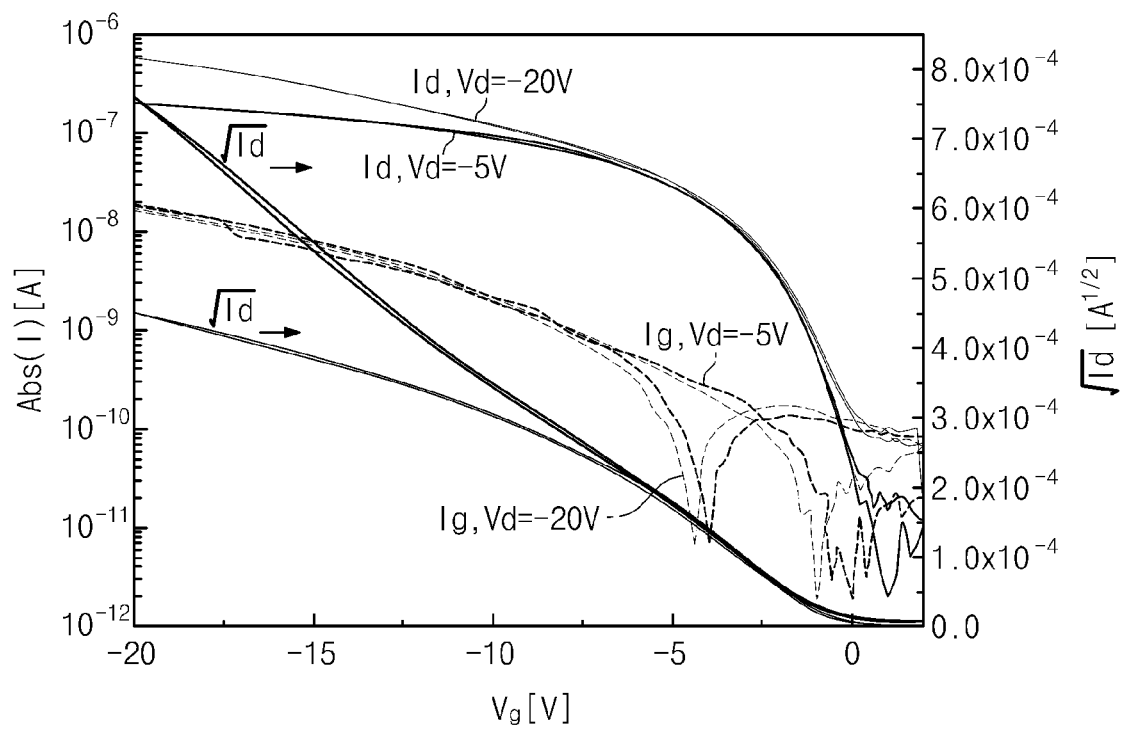
FIG. 3B is a transfer curve of the organic thin film transistors in accordance with embodiments of the present invention.

Referring to FIGS. 3a and 3b, electrical characteristics of top gated organic thin film transistors formed by exemplary embodiments of the manufacturing method are described.

A Eagle 2000 glass slide was used for a substrate, gold electrodes were used as source/drain electrodes, and gold or aluminum electrode was used as a gate electrode. Poly(9,9-dioctylfluorene-co-bithiophene) (F8T2) was used as an organic active layer. An organic insulating layer formed by a cross-linkage between anthracenyl group and maleimide group was used as a gate insulating layer, and the thickness of the gate insulating layer was 150 nm.

Referring to FIG. 3a, an output curve of the organic thin film transistor is described.

When a gate voltage (Vg) was applied at −5V, −10V, −15V, and −20V, the drain current (Id) was measured by varying the drain voltage (Vd). Although the gate voltage and the drain voltage were increased, the drain current was stably measured, thereby confirming the physical stability of an organic insulating layer used in the organic thin film transistors.

Referring to FIG. 3b, a transfer curve of the organic thin film transistor is described.

When a drain voltage (Vd) was applied at −5V and −20V, the drain current (Id) and the gate leakage current (Ig) were measured by varying the gate voltage (Vg). The values of the gate leakage current (Ig) are shown on left Y axis in log scale. Referring to FIG. 3b, the leakage current density was 1 nA/cm$^2$ or less when a gate voltage of −20V and a drain voltage of −20V were supplied.

In addition, a threshold voltage of the organic thin film transistor was calculated by using the measured drain current (Id). The threshold voltage of the organic thin film transistor was −1V. The threshold voltage was calculated by using a contact point at which a graph curve showing the root values of the drain current ($\sqrt{Id}$) meets at x-axis. According to the graph, the organic thin film transistor in the embodiment showed a charge mobility of about 5×10$^{-3}$ cm$^2$/Vs limited to amorphous semiconducting polymer F8T2.

The composition in accordance with embodiments of the present invention can be cross-linked at low temperatures of 100° C. or less.

A cross-linked organic insulating layer can have solvent resistance to other organic solvents. Also, the organic insulating layer may have a durability which high voltages can be endured in thin thicknesses. Because the organic insulating layer can be formed in thin thicknesses, organic thin film transistors including the organic insulating layer can be operated at low threshold voltages. Furthermore, the organic insulating layer has excellent insulation characteristics, which can lead to a reduction in leakage voltage.

Because the manufacturing method in embodiments of the present invention can be performed at low processing temperatures less than 100° C., processing burdens can be reduced and very suitable for top gated geometry.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A composition for organic thin film transistor, comprising:
    a material represented by Chemical Formula I or II; and
    a cross-linker with a maleimide group

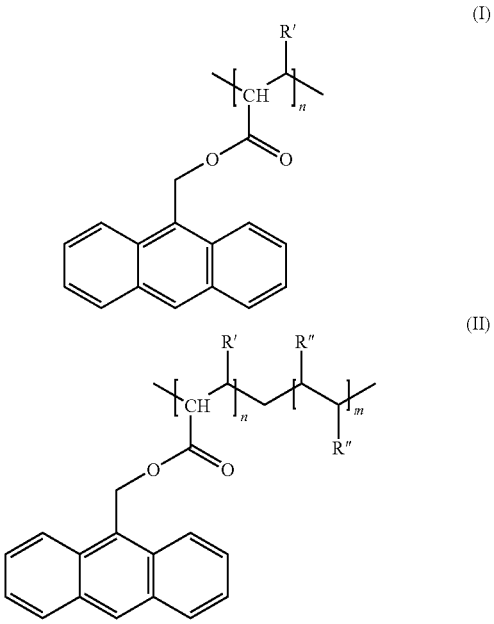

wherein each of R' and R" in Chemical Formula I or II is one selected from a hydrogen atom, a hydroxyl group, an ester group, an amide group, and an alkyl group or an alkoxy group having 1 to 12 carbon numbers, n in Chemical Formula I is a positive integer, and n and m are positive integers in Chemical Formula II and the ratio of m to n (m/n) is more than 0 and less than or equal to 99.

2. The composition of claim 1, wherein the cross-linker with a maleimide group is one selected from Chemical Formulas III, IV, V, and VI:

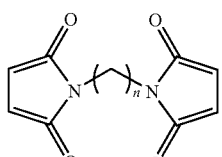
(III)

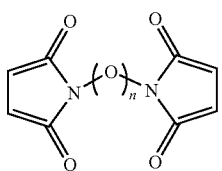
(IV)

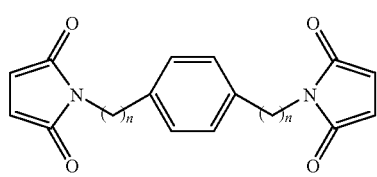
(V)

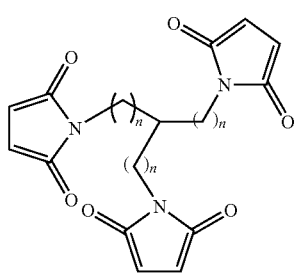
(VI)

where, in Chemical Formulas III, IV, V, or VI, n is an integer of 1 to 10.

3. The composition of claim 2, wherein the amount of the cross-linker is 10 to 100 parts by weight in 100 parts by weight of the material.

4. The composition of claim 1, further comprising an organic solvent.

5. An organic thin film transistor, comprising:
an organic insulating layer formed by a cross-linkage between a material represented by Chemical Formula I or II and a cross-linker with a maleimide group

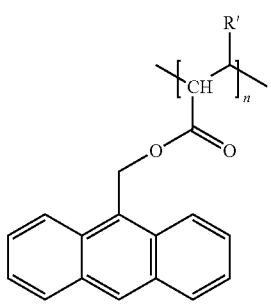
(I)

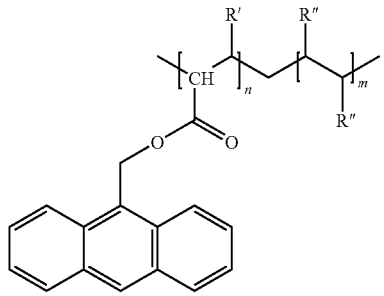
(II)

wherein Chemical Formula I or II, R' and R" each is one selected from a hydrogen atom, a hydroxyl group, an ester group, an amide group, and an alkyl group or an alkoxy group having 1 to 12 carbon numbers, n in Chemical Formula I is a positive integer, and n and m in Chemical Formula II are positive integers and the ratio of m to n (m/n) is more than 0 and less than or equal to 99.

6. The organic thin film transistor of claim 5, wherein the organic insulating layer is formed on a substrate, and further comprising a source electrode, a drain electrode, an organic insulating layer, and a gate electrode.

7. A method for forming organic thin film transistors, comprising:
preparing a solution containing a material represented by Chemical Formula I or II and a cross-linker with a maleimide group;
coating the solution on a substrate; and
subjecting the coated substrate to a heat treatment to form an organic insulating layer on the substrate

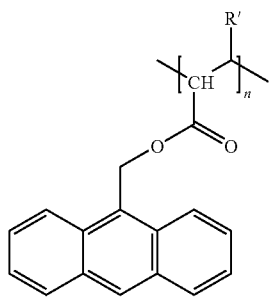
(I)

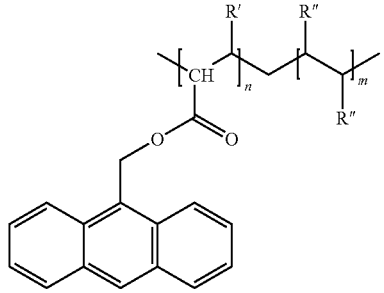
(II)

wherein each of R' and R" in Chemical Formula I or II each is one selected from a hydrogen atom, a hydroxyl group, an ester group, an amide group, and an alkyl group or an alkoxy group having 1 to 12 carbon numbers, n in Chemical Formula I is a positive integer, and n and m in Chemical Formula II are positive integers and the ratio of m to n (m/n) is more than 0 and less than or equal to 99.

8. The method of claim 7, wherein by the heat treatment, a Diels-Alder reaction occurs between the material and the cross-linker.

9. The method of claim 7, further comprising:

forming a gate electrode on the substrate prior to the coating of the solution; and forming an organic active layer on the organic insulating layer and forming a source and a drain after the forming of the organic insulating layer.

10. The method of claim 7, further comprising:

forming a source and a drain on the substrate and forming an organic active layer on the substrate prior to the coating of the solution; and forming a gate electrode on the organic insulating layer after the forming of the organic insulating layer.

* * * * *